(12) United States Patent
Dirk et al.

(10) Patent No.: US 8,859,190 B1
(45) Date of Patent: Oct. 14, 2014

(54) METHOD TO CREATE GRADIENT INDEX IN A POLYMER

(71) Applicant: Sandia Corporation, Albuquerque, NM (US)

(72) Inventors: Shawn M. Dirk, Albuquerque, NM (US); Ross Stefan Johnson, Wilmington, DE (US); Robert Boye, Albuquerque, NM (US); Michael R. Descour, Albuquerque, NM (US); William C. Sweatt, Albuquerque, NM (US); David R. Wheeler, Albuquerque, NM (US); Bryan James Kaehr, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 0 days.

(21) Appl. No.: 14/018,058

(22) Filed: Sep. 4, 2013

Related U.S. Application Data

(60) Provisional application No. 61/697,164, filed on Sep. 5, 2012.

(51) Int. Cl.
  *G03F 7/26* (2006.01)
  *G03F 7/20* (2006.01)
(52) U.S. Cl.
  CPC ........................................ *G03F 7/20* (2013.01)
  USPC .......................................... 430/322; 430/330
(58) Field of Classification Search
  CPC ............ H01L 51/5012; H01L 51/0043; H01L 51/0035; H01L 51/56; H01L 51/0038; H01L 51/0003; H01L 51/5036; C09K 11/06; C09K 2211/1425; C08L 65/00; C08L 2666/06; H01B 1/128; C07C 43/225; C08G 61/00; C08G 61/02; G02B 1/10; G02B 2006/12069; G02B 6/1221; H01G 11/48
  USPC ........................................... 430/322, 330, 321
  See application file for complete search history.

(56) References Cited

U.S. PATENT DOCUMENTS

| 5,328,809 | A | * | 7/1994 | Holmes et al. | ................ | 430/321 |
| 5,771,098 | A | * | 6/1998 | Ghosh et al. | ................. | 356/508 |
| 7,955,945 | B1 | | 6/2011 | Dirk | | |
| 8,426,321 | B1 | | 4/2013 | Dirk | | |
| 2008/0090155 | A1 | * | 4/2008 | Stewart et al. | .................... | 430/5 |

OTHER PUBLICATIONS

Mamin, H.J. Thermal Writing Using a Heated Atomic Force Microscope Tip, American Institute of Physics, Appl. Phys. Lett. 69(3), Jul. 15, 1996.*
Johnson, Ross S. et al., "Photopatterning poly(p-phenylenevinylene) from xanthate precursor polymers", Chemical Communications, vol. 47, p. 3936, 2011.
Prelipceanu, Marius et al., "Study of thermal conversion and patterning of a new soluble poly (p-phenylenevinylene) (PPV) precursor", Materials Science in Semiconductor Processing, vol. 10, p. 77, 2007.

(Continued)

*Primary Examiner* — Caleen Sullivan
(74) *Attorney, Agent, or Firm* — Kevin W. Bieg

(57) ABSTRACT

Novel photo-writable and thermally switchable polymeric materials exhibit a refractive index change of $\Delta n \geq 1.0$ when exposed to UV light or heat. For example, lithography can be used to convert a non-conjugated precursor polymer to a conjugated polymer having a higher index-of-refraction. Further, two-photon lithography can be used to pattern high-spatial frequency structures.

17 Claims, 4 Drawing Sheets

(56) References Cited

OTHER PUBLICATIONS

Ho, Peter K. H. et al., "All-Polymer Optoelectric Devices", Science, vol. 285, p. 233, 1999.

Whitaker, Matthew et al., Microfabrication of Graded Index Lenses Using Two Photon Induced Polymerization, Trends in Optics and Photonics, 88, Conference on Lasers and Electro-Optics (CLEO) 2003 paper: CWA4/1.

* cited by examiner

METHOD TO CREATE GRADIENT INDEX IN A POLYMER

CROSS-REFERENCE TO RELATED APPLICATION

This application claims the benefit of U.S. Provisional Application No. 61/697,164, filed Sep. 5, 2012, which is incorporated herein by reference.

STATEMENT OF GOVERNMENT INTEREST

This invention was made with Government support under contract no. DE-AC04-94AL85000 awarded by the U.S. Department of Energy to Sandia Corporation. The Government has certain rights in the invention.

FIELD OF THE INVENTION

The present invention relates to gradient index optical materials and, in particular, to a method to create gradient index in a photo-writable or thermally switchable polymeric material.

BACKGROUND OF THE INVENTION

Graded index (GRIN) glasses have been used for specific optical applications, e.g. GRIN lenses for fiber optics, for decades. Additionally, GRIN materials have been shown to provide advantages in more general lens designs. Unfortunately, actual utilization of GRIN materials has been limited to niche applications. This is due to limitations in the available index-of-refraction ranges and the cumbersome manufacturing required.

Since the introduction of gradient index optics in late 1960s there have been many attempts to improve the method of production or the materials used to create such optics. Methods including neutron irradiation, chemical vapor deposition, polymerization techniques, ion exchange, and crystal growth have all been explored. See D. T. Moore, *Applied Optics* 19, 1035 (1980). Photolithography has been used to induce gradient index lenses. See O. Doyle and T. Galstian, *Optics Express* 17, 4970 (2009). More recently, nanosized layered structures of two different types of polymers have been used to create graded-index lenses. See M. Sandrock et al., *Applied Physics Letters* 84, 3621 (2004); and A. R. Kamdar et al., *Annual Technical Conference—Society of Plastics Engineers* 65, 1743 (2007). However, In all cases the differences in index are relatively low and manufacturing of made-to-order lenses with the current material sets is very expensive.

Therefore, a need remains for a simple method to pattern a polymer to create a gradient index.

SUMMARY OF THE INVENTION

The present invention is directed to photo-writable material (PWM) or thermally switchable material (TSM) polymer systems which can be used to create a gradient index. The method to create a gradient index in a polymer comprises providing a low-index non-conjugated precursor polymer having a photo- or thermally cleavable leaving group and photoexposing or thermally activating the precursor polymer to eliminate the cleavable leaving group, thereby providing a conjugated polymer having a higher index-of-refraction than the precursor polymer. For example, a PWM can be photo-patterned using conventional contact lithography or multiphoton lithography. For example, a TSM can be patterned by localized heating using an atomic force microscope or by exposure to photons. For example, the precursor polymer can be a precursor to poly(phenylene vinylene) (PPV) and the leaving group can be a xanthate. The polymers can be further improved by incorporation of alkoxysilane functional groups. For example, adding trialkoxysilane groups can provide reactive sites for acid or base catalyzed condensation reactions which can improve the mechanical properties of the polymers by introducing silica-like material intimately within the matrix while still enabling photo- or thermally-activated patterning.

The precursor polymers can have index-of-refraction values as low as 1.3. Upon being written with UV light or localized high temperature, the non-conjugated polymer chemically converts to conjugated polymer with an extended electronic structure and known indices as high as 2.7. This index-of-refraction change is significantly larger than current GRIN material systems. A material with this ability enables a wide range of optical applications ranging from micro-to macro-optics. Very inexpensive conventional lenses can be used as starting materials which can be modified to create more advanced optics at low cost. For example, low cost spherical lenses can be aspherized with a thin layer of PWM or TSM on one or multiple surfaces. These materials enable manufacturing methods wherein optics can be built using an additive process rather than relying on a subtractive process. For example, diffractive elements can be directly written within the material without a need for etching material. The optics fabrication process enables high throughput and customization of each manufactured article. For example, high throughput can be achieved by using parallel 3D direct write patterning, e.g., using the lithography equivalent of multiphoton multifocal microscopy. Further, the large index change enables entire optical systems to be written within a volume of the material. The material system and its patterning can reduce the size, weight, and cost of cameras, binoculars, rifle telescopes, and a wide variety of imaging or computational sensors.

BRIEF DESCRIPTION OF THE DRAWINGS

The detailed description will refer to the following drawings, wherein like elements are referred to by like numbers.

DETAILED DESCRIPTION OF THE INVENTION

State-of-the-art GRIN optical materials are limited by factors such as the magnitude of the index of refraction change ($\Delta n$), the ultimate diameter of the GRIN lens, and the high cost of manufacturing. The present invention is directed to method to make inexpensive "made-to-order" manufacturable GRIN optics that rely on the use of PWMs or TSMs that can be converted from a low to a high index state. The PWMs and TSMs preferably have good optical properties, e.g. high uniformity and low absorption, with potentially large available refractive index change, $\Delta n$, and spatial gradient, $\Delta n/\Delta x$. Preferably, $\Delta n \geq 1$. According to the present invention, photoexposure of a photo-writable low-index precursor polymer induces an elimination reaction that causes double-bond conjugation thus increasing the index-of-refraction. These polymers can be used to fabricate advanced optics with a $\Delta n \geq 1$ within the same medium, when converted between the two index states. Control of the degree of conjugation can be used to enable a true analog approach to patterning gradient index optics.

Figure 1:
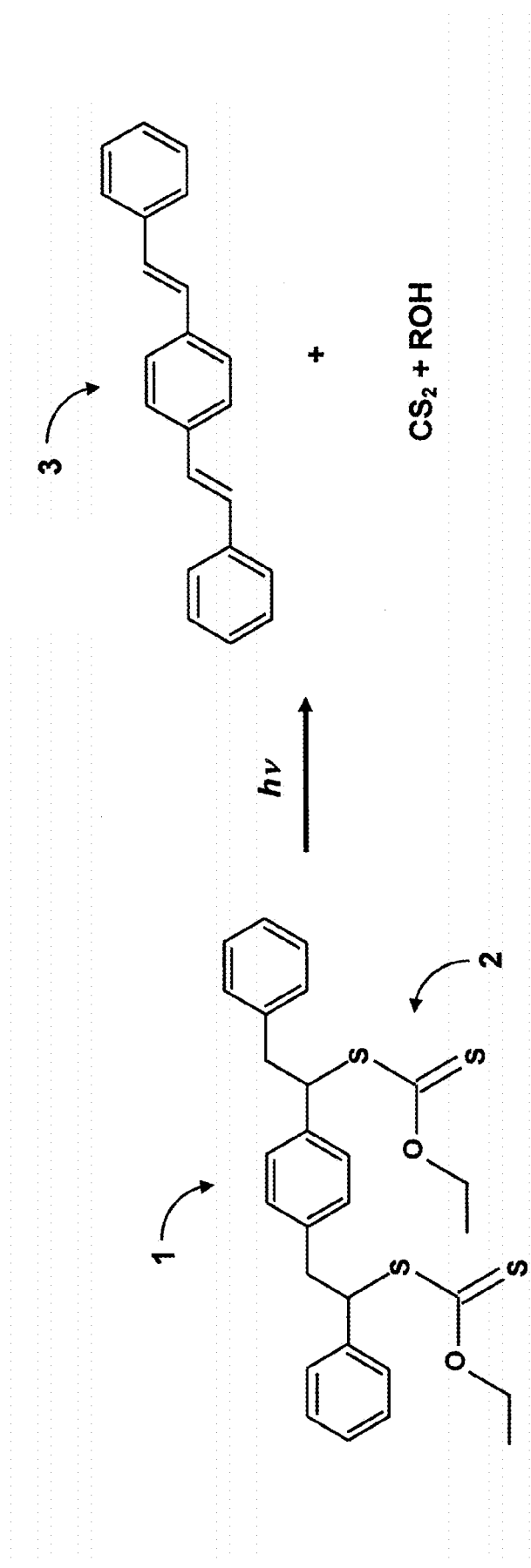
FIG. 1 shows an example of the invention wherein a low-index non-conjugated precursor polymer is converted to a high-index conjugated polymer by exposure to UV light.

An example of the present invention is illustrated in FIG. 1. A low-index non-conjugated precursor polymer having a photocleavable leaving group is provided. In this example, the low-index non-conjugated precursor polymer comprises a precursor 1 to poly(p-phenylene vinylene) (i.e., a poly(p-xylylene derivative). In this example, the leaving group comprises a xanthate 2. Photoexposing the precursor polymer eliminates the photocleavable leaving group, thereby providing a conjugated polymer having a higher index-of-refraction than the precursor polymer. In this example, when the poly(p-phenylene vinylene) precursor 1 is exposed to UV light hv, the xanthate 2 eliminates as carbon disulfide $CS_2$ and an alcohol ROH, thereby providing the conjugated polymer poly(p-phenylene vinylene) 3 having a higher index-of-refraction than the precursor 1.

Synthetic routes to PPV precursor polymers have been developed for capacitor applications. See U.S. Pat. No. 7,955,945 to Dirk et al. and U.S. Pat. No. 8,426,321 to Dirk et al., which are incorporated herein by reference. The synthetic route for preparing PPV can have a large effect on its properties. See S. Son et al., *Science* 269, 376 (1995); and S.-C. Lo et al., *Journal of Materials Chemistry* 11, 2228 (2001). Optical patterning of precursor polymers obtained by the Wessling route, wherein the leaving group is a sulfonium salt, has previously been reported. See D. Credgington et al., *Advanced Functional Materials* 20, 2842 (2010). However, several disadvantages are associated with the sulfonium precursor polymer; namely, low stability, low solubility in nonpolar solvents (which are superior for spin-coating), and elimination of HCl (which can degrade indium-tin oxide and other potential components of a device). See S. Son et al., *Science* 269, 376 (1995); and S.-C. Lo et al., *Journal of Materials Chemistry* 11, 2228 (2001). Xanthate precursor polymers, on the other hand, are very stable, highly soluble in non-polar organic solvents, and eliminate non-caustic side-products during elimination. Thus, the ability to photopattern xanthate precursor polymers provides several advantages over sulfonium precursor polymers. Examples of other precursor polymers that can be used include, but are not limited to, precursors to polyacetylene, poly(p-phenylene), poly(thiophene vinylene), poly(pyrrole vinylene), poly(1,4-naphthylene vinylene), poly(p-pyridine vinylene), and substituted versions thereof. Examples of other leaving groups that can be used include, but are not limited to, acetates, dithiocarbamates, sulfinyl, sulfoniums, and halogens.

Figure 2:
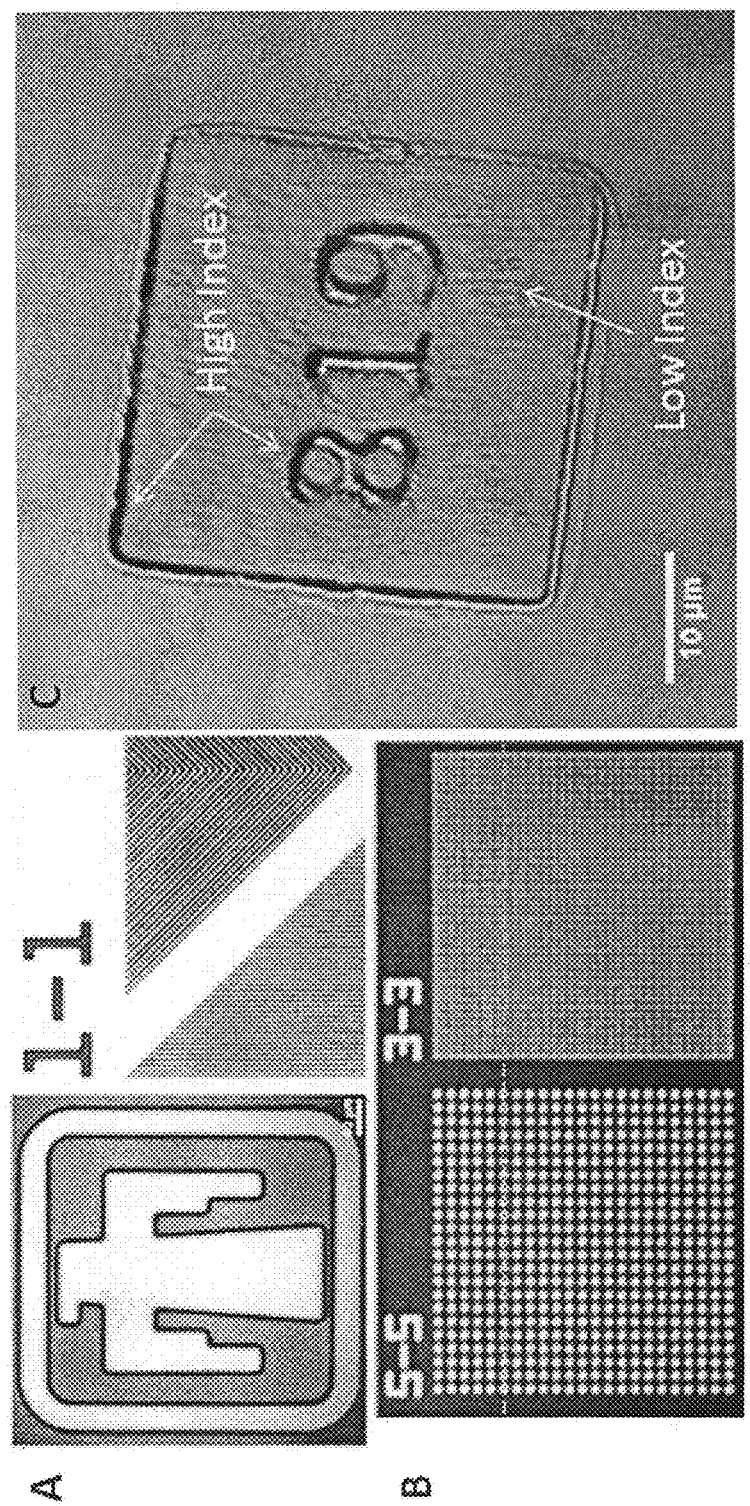
FIGS. 2A and 2B show optical and fluorescence microscopy images of patterned PPV.
FIG. 2C shows a dark field image of a two-photon lithographically patterned PPV.

Lithography can be used to convert the non-conjugated precursor polymers which contain xanthate groups to conjugated PPV polymers. See R. S. Johnson et al., *Chemical Communications* 47, 3936 (2011), which is incorporated herein by reference. Conjugated PPV features with sizes as small as 1 μm can be produced using simple contact lithography. FIGS. 2A and 2B show optical and fluorescence microscopy images of patterned PPV. The numbers indicate the feature size and spacing (in microns). Multiphoton lithography can also be used to pattern the polymers. FIG. 2C shows a dark field image of a two-photon lithographically patterned PPV precursor polymer containing 2% (w/w) sensitizer using an ultra-fast, 80 MHz pulsed Ti-sapphire laser with 60 fs pulses and a 500 nm spot size at 750 nm wavelength. The initial PPV precursor polymers prior to conversion can have index-of-refraction values as low as 1.3 at 632 nm. See M. Prelipceanu et al., *Materials Science in Semiconductor Processing* 10, 77 (2007). Conjugated polymers of the PPV type can have indices of refraction (n) as high as 2.7 at 550 nm depending upon synthesis technique. See P. K. H. Ho et al., *Science* 285, 233 (1999). Therefore, this material set can provide a solid change in magnitude of the index-of-refraction of as much as $\Delta n = 1.4$, which is almost an order of magnitude better than tunable refractive index materials which have been reported in the literature. See M. Sandrock et al., *Applied Physics Letters* 84, 3621 (2004).

The precursor materials can be patterned using two-photon lithography, a type of multiphoton lithography (MPL). MPL is a method for the fabrication of intricately 3D-structured materials with nanoscale precision. Previously, pulsed laser light has been focused into a photosensitive reagent solution to initiate photochemical reactions by a multiphoton absorption process. This nonlinear excitation is restricted to regions of high photon density (i.e., proximal to the focal volume of a focused laser beam), enabling photochemical reactions, such as photopolymerization and photocrosslinking, to be confined to highly resolved 3D volumes on the order of ~1 femtoliter. See L. D. Zarzar et al., *Angewandte Chemie, International Edition* 50, 9356 (2011). Recently, two-photon lithography has been used to create many elaborate 3D structures including embedded waveguides within a 3D matrix material. See V. Schmidt et al., *Journal of Laser Micro/Nanoengineering* 2, 170 (2007). Two-photon lithography has also been used to polymerize monomers to create microfabricated graded index lenses consisting of monomers and polymers. See M. Whitaker et al., *Trends in Optics and Photonics* 88, CWA4/1 (2003).

Figure 3:
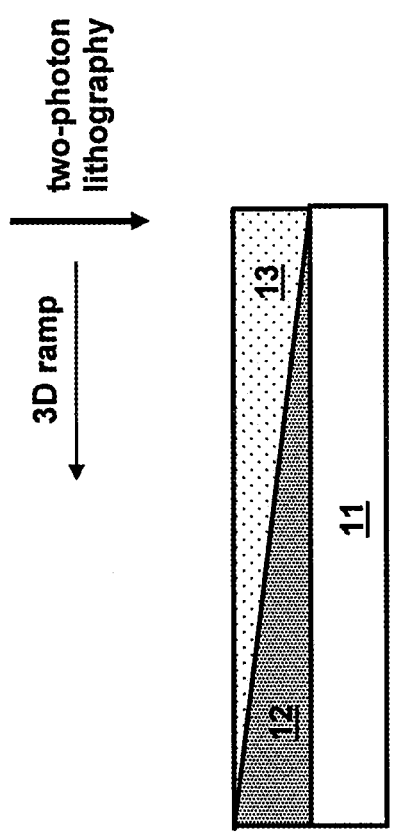
FIG. 3 is a schematic illustration of the fabrication of a graded-index structure using two-photon lithography.

The non-conjugated precursor polymer can be exposed to different doses of photons in different regions to create a graded index material. For example, two-photon lithography can be used to pattern conjugated PWMs in three dimensions. In particular, two-photon lithography can be used to form graded-index structures, as shown in FIG. 3. For example, a relatively thin (e.g., 10 μm) layer of PWM can be applied to the surface of a glass substrate 11 and two-photon lithography with a small lateral spot size (e.g., 500 nm) can be used convert the low-index material 13 to a high-index material 12 in a 3D ramp pattern.

Figure 4:
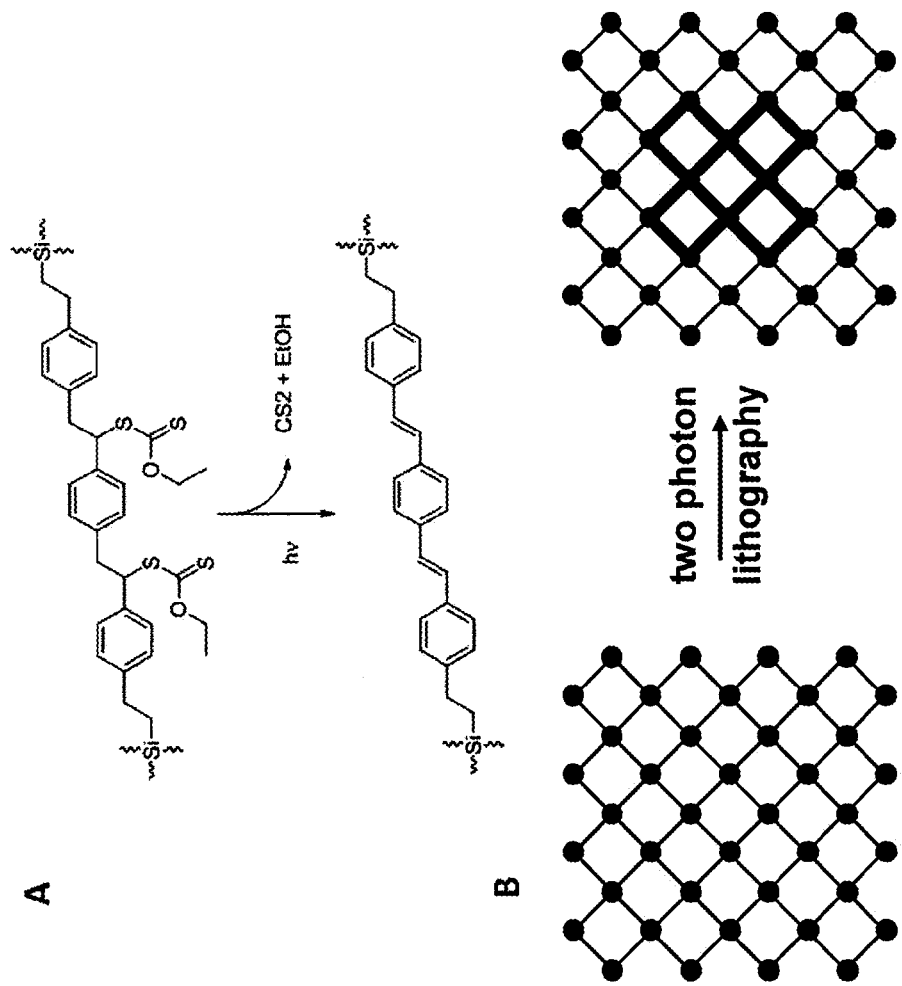
FIG. 4A shows a silane linker used to create a photo-switchable refractive index changing sol-gel based material.
FIG. 4B shows a schematic illustration of patterning using two-photon lithography wherein the solid dots represent silicon atoms, the light lines represent unconverted precursor linkers and the heavy lines represent photo-converted conjugated linkers.

The precursor polymers can be modified to incorporate alkoxysilane functional groups which can improve the mechanical properties of the photo-writable materials while still enabling photopatterning. For example, as shown in FIG. 4A, adding trialkoxysilane end groups can provide reactive sites for acid or base catalyzed condensation reactions which can crosslink the precursor polymers and improve the mechanical properties of the polymers by introducing silica-like material intimately within the matrix while still enabling photo- or thermally-activated patterning. FIG. 4B shows a schematic illustration of patterning using two-photon lithography wherein the solid dots represent silicon atoms, the light lines represent unconverted precursor linkers and the heavy lines represent photo-converted conjugated linkers. The addition of silane functionality may more closely match the volumetric coefficient of thermal expansion of the lens materials being modified. In addition, the modified materials can be stronger since they can be crosslinked after the sol-gel condensation reactions, enabling both polishing of the polymer as well as molding of larger scale lenses.

The optics fabrication process of the present invention can combine high-throughput with customization of each manufactured article. For example, high throughput can be achieved by parallel patterning, e.g., using the lithography equivalent of multiphoton multifocal microscopy. See K. Bahlmann et al., *Opt Express* 15, 10991 (2007). Given the measured dose needed for conversion of the exemplary PPV material, the output power of a single Ti-sapphire pulsed laser can be divided into 30-50 focal spots for patterning. In combination with the PPV material system, two-photon lithography offers 3D control of refractive index in thicknesses up to 400 μm (nominally limited by working distance of high-NA microscope optics). Optical systems that do not fit into the thickness constrained by two-photon lithography can be assembled by stacking and using interferometric alignment features patterned by the same two-photon manufacturing process.

There are many applications for optical materials in which a $\Delta n \geq 1$ can be achieved with lithography-level positional control. Three-dimensional patterning of optics within a PWM layer enables flexible manufacturing of symmetric or asymmetric optics in which both surfaces and the media bounded by them are put to use. For example, photo-conversion of a PWM decoration layer on an ordinary lens enables conversion of spherical surfaces to aspheric surfaces. For example, a thin (i.e., 10-100 μm) layer of PWM can be deposited on a surface or surfaces of a single lens or sandwiched in a cemented assembly of ordinary lenses. Photopatterning of such a decoration layer can be used to produce an aspheric surface or correct fabrication errors in the ordinary lens (e.g., surface or element decenters). Less expensive aspheric lenses fabricated from PWM-modified ordinary lenses generally allows the use of fewer optical elements in a system, resulting in savings in size, weight, improving throughput, and reducing costs. Also, PWMs can be patterned in three dimensions using two-photon lithography as described above. Individual or multiple PWM layers can be patterned in three dimensions to fabricate an entire optical system or arrays of optical systems. Parallelization of two-photon lithography enables high throughput and highly flexible manufacturing of GRIN optics. Also, arrays of microlenses can be written on glass plates using this methodology. The combination of novel materials and photo-patterning methods enables reductions in weight and cost of conventional optics as well as the manufacturing of unique optical systems, e.g., an ultra-wide field-of-view or computational-imaging system.

The present invention has been described as a method to create gradient index in a polymer. It will be understood that the above description is merely illustrative of the applications of the principles of the present invention, the scope of which is to be determined by the claims viewed in light of the specification. Other variants and modifications of the invention will be apparent to those of skill in the art.

We claim:

1. A method to create a gradient index in a polymer, comprising:
    providing a low-index non-conjugated precursor polymer having a photocleavable leaving group; and
    photoexposing the precursor polymer to eliminate the photocleavable leaving group, thereby providing a conjugated polymer having a higher index-of-refraction than the precursor polymer, wherein the non-conjugated precursor polymer is exposed to different doses of photons in different regions to create a graded index material.

2. The method of claim 1, wherein the non-conjugated precursor polymer comprises a precursor to poly(phenylene vinylene).

3. The method of claim 1, wherein the non-conjugated precursor polymer comprises a precursor to polyacetylene, poly(p-phenylene), poly(thiophene vinylene), poly(pyrrole vinylene), poly(1,4-naphthylene vinylene), poly(p-pyridine vinylene), or a substituted version thereof.

4. The method of claim 1, wherein the photocleavable leaving group comprises a xanthate.

5. The method of claim 1, wherein the photocleavable leaving group comprises an acetate, dithiocarbamate, sulfinyl, sulfonium, or halogen.

6. The method of claim 1, wherein the precursor polymer further comprises at least one alkoxysilane end group to enable crosslinking of the precursor polymer.

7. The method of claim 1, wherein the photoexposing comprises photopatterning.

8. The method of claim 7, wherein the photopatterning is accomplished using contact lithography.

9. The method of claim 7, wherein the photopatterning is accomplished using multiphoton lithography.

10. A method to create a gradient index in a polymer, comprising:
    providing a low-index non-conjugated precursor polymer comprising a thermally activated leaving group; and
    locally heating the precursor polymer to eliminate the leaving group, thereby providing a conjugated polymer having a higher index-of-refraction than the precursor polymer, wherein the non-conjugated precursor polymer is exposed to different amounts of local heating in different regions to create a graded index material.

11. The method of claim 10, wherein the non-conjugated precursor polymer comprises a precursor to poly(phenylene vinylene).

12. The method of claim 10, wherein the non-conjugated precursor polymer comprises a precursor to polyacetylene, poly(p-phenylene), poly(thiophene vinylene), poly(pyrrole vinylene), poly(1,4-naphthylene vinylene), poly(p-pyridine vinylene), or a substituted version thereof.

13. The method of claim 10, wherein the thermally activated leaving group comprises a xanthate.

14. The method of claim 10, wherein the thermally activated leaving group comprises an acetate, dithiocarbamate, sulfinyl, sulfonium, or halogen.

15. The method of claim 10, wherein the precursor polymer further comprises at least one alkoxysilane end group to enable crosslinking of the precursor polymer.

16. The method of claim 10, wherein the locally heating is accomplished using an atomic force microscope.

17. The method of claim 10, wherein the locally heating is achieved by exposure to photons.

* * * * *